United States Patent
Toki et al.

[11] Patent Number: 6,092,227
[45] Date of Patent: Jul. 18, 2000

[54] TEST CIRCUIT

[75] Inventors: Hideki Toki, Hyogo; Akira Kitaguchi; Makoto Hatakenaka, both of Tokyo; Kiyoyuki Shiroshima, Hyogo; Masaaki Matsuo; Tsuyoshi Saitoh, both of Nagasaki, all of Japan

[73] Assignees: Mitsubishi Electric System LSI Design Corporation, Hyogo; Mitsubishi Denki Kabushiki Kaisha, Tokyo, both of Japan

[21] Appl. No.: 09/018,934

[22] Filed: Feb. 5, 1998

[30] Foreign Application Priority Data

Sep. 19, 1997 [JP] Japan .................................. 9-255691

[51] Int. Cl.$^7$ .................................................. G01R 31/28
[52] U.S. Cl. .............................................................. 714/736
[58] Field of Search ...................... 714/718, 719, 714/736, 42, 54, 820; 365/200, 201

[56] References Cited

U.S. PATENT DOCUMENTS

| | | | |
|---|---|---|---|
| 4,369,511 | 1/1983 | Kimura et al. .......................... | 714/719 |
| 4,450,560 | 5/1984 | Conner ..................................... | 714/736 |
| 4,736,373 | 4/1988 | Schmidt ................................... | 714/711 |
| 4,991,139 | 2/1991 | Takahashi et al. ....................... | 714/718 |
| 5,062,109 | 10/1991 | Ohshima et al. ........................ | 714/719 |
| 5,412,662 | 5/1995 | Honma et al. ........................... | 714/718 |
| 5,909,448 | 6/1999 | Takahashi ................................ | 365/201 |

FOREIGN PATENT DOCUMENTS 60-185300 9/1985 Japan .

*Primary Examiner*—Albert De Cady
*Assistant Examiner*—Shelly A Chase
*Attorney, Agent, or Firm*—Leydig, Voit & Mayer

[57] ABSTRACT

A test circuit includes a writing unit that outputs m-bit data captured upon receipt of a clock signal, branches the m-bit data n identical m-bit data signals, and stores the n m-bit data signals in a memory device. A function determining unit reads the n m-bit data signals from the memory, compares one of the n m-bit data signals to an m-bit expected value, and determines coincidence or non-coincidence between the n m-bit data signal and an expected value.

3 Claims, 3 Drawing Sheets

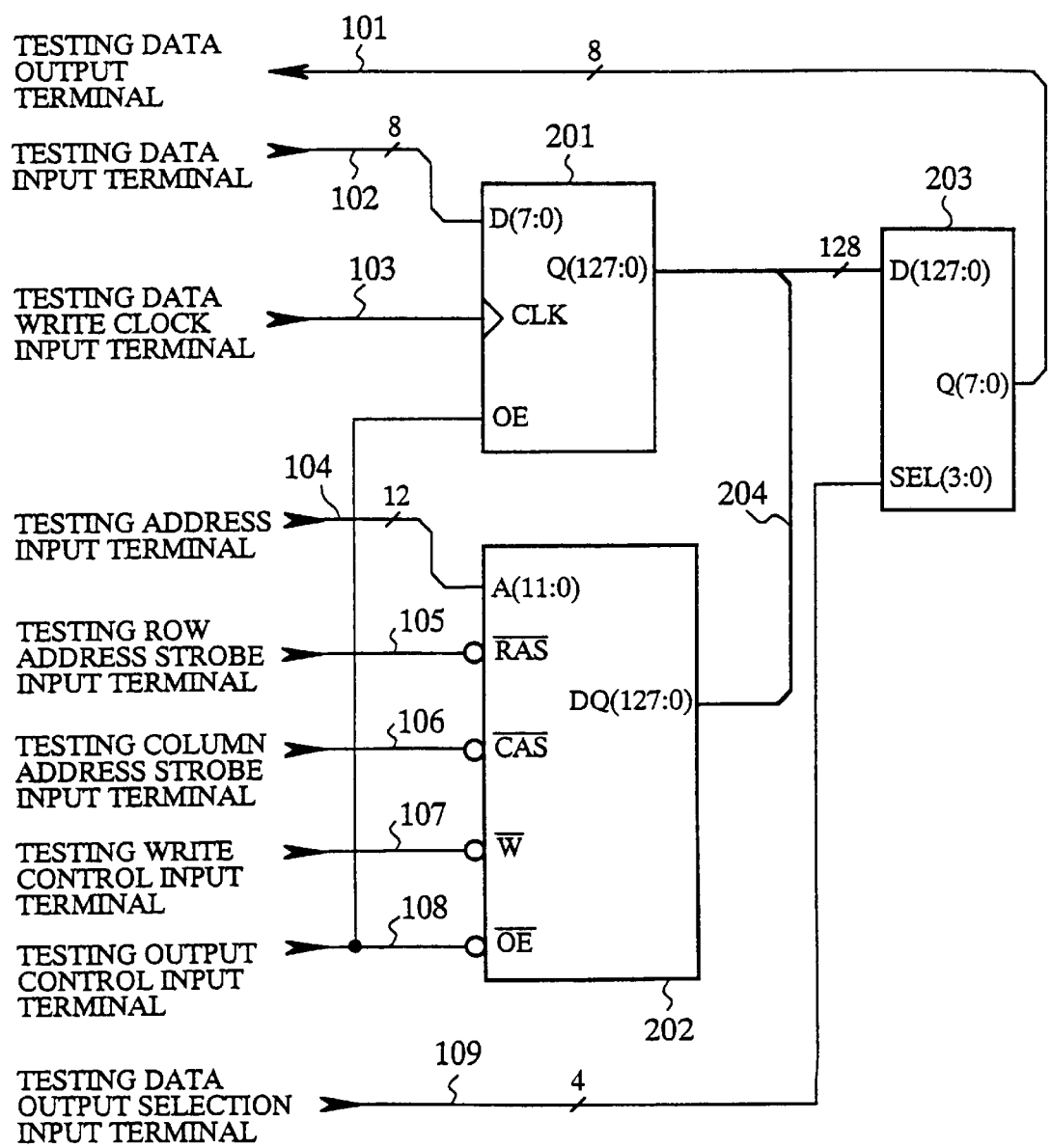

TEST CIRCUIT

BACKGROUND OF THE INVENTION

1. Field of the Invention

The present invention relates to a test circuit which is suitable for use in a semiconductor integrated circuit wherein a memory device having a wide data bus and logic circuits are mixed together on a single chip and which is provided on the same chip as the semiconductor integrated circuit and used to perform a unit test of the memory device.

2. Description of the Prior Art

FIG. 3 is a circuit diagram showing a conventional test circuit. In the drawing, reference numeral 201 indicates a shift register for successively shifting and writing therein m-bit testing data (input data) inputted from a testing data input terminal 102 in accordance with a clock pulse inputted from a testing data write clock input terminal 103. The shift register 201 is capable of writing data of m-bit×n stages (m×n bits) (where m and n: 0 or natural numbers) therein. Incidentally, the shift register 201 shown in FIG. 3 shows the writing of data of 8-bit×16 stages (i.e., 128 bits) therein. Further, the shift register 201 controls an output, based on a control signal inputted from a testing output control input terminal 108.

Reference numeral 202 indicates a 16-Mbit DRAM (Dynamic Random Access Memory) used as a memory device to be tested. The DRAM 202 inputs or receives addresses (row and column addresses) in accordance with control signals supplied from a testing address input terminal 104, a testing row address strobe input terminal 105 and a testing column address strobe input terminal 106 and writes the testing data of the shift register 201 into or at the input addresses in accordance with a control signal inputted from a testing write control input terminal 107. Further, the DRAM 202 is also provided with the function of controlling an output, based on the control signal (corresponding to a control signal obtained by inverting the control signal inputted to the shift register 201) supplied from the testing output control input terminal 108 in a manner similar to the shift register 201.

Reference numeral 203 indicates a multiplexer for outputting a plurality of input data to a testing data output terminal 101 in response to a selection control signal inputted from a testing data output selection input terminal 109. Reference numeral 204 indicates a wide data bus having a m×n bit width (where m: testing data bus bit width of chip and n: internal wide data bus bit width/m), for connecting the shift register 201, the DRAM 202 and the multiplexer 203 to each other. The bit width of the wide data bus 204 shown in FIG. 3 indicates a 8×16 (128) bit width.

Incidentally, numerals (4, 8, 12 and 128) assigned to respective wiring or conductors respectively indicate the number of bits of data to be transferred.

Further, D (7:0) and Q (127:0) of the shift register 201, A (11:0) and DQ (127:0) of the DRAM 202, and D (127:0), Q (7:0) and SEL (3:0) of the multiplexer 203 also indicate the numbers of bits of data to be input and output and the number of data input and output terminals, respectively. For example, D (7:0) of the shift register 201 shows the input of 8-bit data therein.

The operation of the present test circuit will next be described.

(1) The operation of writing of testing data into the DRAM 202 will first be explained.

The testing data (input data) inputted from the testing data input terminal 102 is written into the shift register 201 by eight bits for every one clock pulse in response to the leading edge of the clock pulse inputted from the testing data write clock input terminal 103.

Thus, since the 128-bit testing data is written into the shift register 201 (i.e., the Q (127:0) of the shift register 201 from the Q (127:119) to Q (7:0)) by eight bits every one-shot clock pulse, sixteen clock pulses are required to write the 128-bit testing data into the shift register 201.

Although the testing data is successively written into the shift register 201 by eight bits, the testing data written into the shift register 201 is always outputted from the outputs Q (127:0). However, when the shift register 201 is provided with the output control function and the control signal, e.g., H level (corresponding to 1 defined in logic) inputted from the testing output control input terminal 108 is inputted to an output enable input (OE) of the shift register 201, the data written into the shift register 201 is prohibited from being outputted from the Q (127:0) (i.e., the shift register 201 is controlled not to output the data from the outputs Q (127:0)). Since, on the other hand, the control signal indicative of the H level (1) inputted from the testing output control input terminal 108 is inverted by the DRAM 202 and inputted therein (i.e., the DRAM 202 is supplied with L level (0)), the outputs DQ (127 0) of the DRAM 202 are placed in a state in which the DRAM 202 may output data in contrast with the outputs Q (127:0) of the shift register 201 which cannot output data. Thus, the outputs of the shift register 201 and the DRAM 202 are controlled by the control signal inputted from the testing output control input terminal 108 to avoid the collision between the data transferred to the wide data bus 204.

When the testing data (128-bit testing data) corresponding to sixteen clock pulses is written into the shift register 201 by eight bits, the control signal inputted from the testing output control input terminal 108 is changed from the H level (1) to the low level (0). As a result, the outputs Q (127:0) of the shift register 201 are placed in a state in which the shift register 201 may output the testing data, whereby the testing data is outputted from the shift register 201. Thus, the 128-bit testing data written into the shift register 201 is written into the DRAM 202 in one write operation through the wide data bus 204 configured in 128-bit width.

Upon write operation, the DRAM 202 receives L level (0) obtained by inverting the control signal indicative of the H level (1) inputted from the testing write control input terminal 107. Upon read operation, the DRAM 202 receives the H level (1) obtained by inverting the control signal indicative of the L level (0) inputted from the testing write control input terminal 107. Thus, when the 128-bit testing data is written into the DRAM 202, the control signal indicative of the H level (1) is sent to the DRAM 202 from the testing write control input terminal 107.

The 128-bit testing data is written into the corresponding addresses indicative of storage places for the data to be stored in the DRAM 202 in one write operation. It is thus necessary to write the addresses in the DRAM 202 in advance before the writing of the testing data into the DRAM 202. The addresses are inputted from the testing address input terminal 104 as 12-bit address data. When the row addresses of the addresses are inputted to the DRAM 202, the control signal inputted from the testing address strobe input terminal 105 is rendered H in level and its inverted L level (0) signal is inputted to a RAS (Row Address Strobe) of the DRAM 202. When, on the other hand, the column addresses are inputted to the DRAM 202, the control signal inputted from the testing address strobe input terminal 106 is rendered H (1) in level and its reversed L level (0) signal is inputted to a CAS (Column Address Strobe) of the DRAM 202. Upon normal conditions (when no row and column addresses are input), the control signals inputted from the testing row address strobe input terminal 105 and the testing column address strobe input terminal 106 are respectively Low (0) and hence the signal High (1) is inputted to each of the RAS and CAS of the DRAM 202.

The address data sent from the testing address input terminal 104 is represented as 12 bits. The row addresses are represented as combinations of [1,0] corresponding to 12 bits of the address data, i.e., $2^{12}$ rows (4096 rows), whereas the column addresses are represented as combinations of [1,0] corresponding to 5 bits of 12 bits of the address data, i.e., $2^5$ columns (32 columns).

(2) The operation of reading of the testing data written into the DRAM 202 (at the time of the determination as to the function of the DRAM 202) will next be explained.

The control signal inputted from the testing output control input terminal 108 is switched to the H level (1) (the inverted signal L level (0) is inputted to the DRAM 202) to thereby bring the DQ (127:0) of the DRAM 202 into a state in which it may output data. Further, the control signal inputted from the testing write control input terminal 107 is switched to the L level (0) (the inverted signal H level (1) is inputted to the DRAM 202) to thereby place the inputs DQ (127:0) of the DRAM 202 in a data read state. The testing data written into the DRAM 202 is read out in one read operation and transferred to the multiplexer 203 through the wide data bus 204.

When the testing data is sent to the multiplexer 203, the testing data output selection input terminal 109 is switched 16 times (n times) to read the testing data into the testing data output terminal 101 of the chip from the multiplexer 203 in units of 8 bits (m bits). Incidentally, the selection control signal inputted from the testing data output selection input terminal 109 includes 4 bits to allow switching between 16 signals. A comparison between the read 8-bit testing data and a prepared 8-bit expected value is performed 16 times (n times) to thereby make a decision as to the function of the DRAM 202.

Incidentally, JP-A-60/185300 is disclosed as a prior art reference related to the present application.

The conventional test circuit has the following problems because it is constructed as described above.

(1) Upon writing the testing data into the shift register 201, the sixteen clock pulses must be applied to the shift register 201. Therefore, a test time interval is spent by these clock pulses.

(2) In order to determine, by the wide data bus, whether the testing data written into the DRAM 202 is normal or abnormal, the selection signal inputted from the testing data output selection input terminal 109 is switched 16 times (n times) to thereby read the testing data from the 8-bit (m-bit) testing data output terminal 101 of the chip. Further, the comparison between the read testing data and the 8-bit (m-bit) expected value must be performed 16 times (n times). Therefore, a further test time interval is spent.

If the testing data output terminal 101 is represented as 128 bits, then the 128-bit testing data can be read from the 128-bit testing data output terminal 101. It is therefore considered that the need for 16-time switching between the signals by the multiplexer 203 is eliminated and the comparison between the testing data and the 128-bit expected value can be performed at one time. However, since limitations are imposed on the number of pins in a package for a semiconductor integrated circuit (IC), the testing data output terminal 101 is dedicated to a testing terminal to the end, and the large number of pins cannot be shared with the testing data output terminal 101, the testing data output terminal 101 is set to 8 bits.

SUMMARY OF THE INVENTION

With the foregoing problems in view, it is therefore an object of the present invention to provide a test circuit capable of reducing the time (function determining time) required to write data into or read data from a memory device, shortening a test time interval and reliably performing a unit test of the memory device.

According to a first aspect of the present invention, there is provided a test circuit comprising:

data writing means for outputting m-bit data immediately after the m-bit data is captured from an input/output terminal by a one-shot clock, causing the m-bit data to branch to n and allowing a memory device to write n the m-bit data identical to each other;

function determining means for reading n the m-bit data written into the memory device, outputting one of n the m-bit data from the input/output terminal, comparing the one m-bit data and a prepared m-bit expected value and making a decision as to the coincidence or non-coincidence between n the m-bit data; and a wide data bus connected to the data writing means, the memory device and the function determining means and capable of performing the transfer of n the m-bit data between the data writing means, the memory device and the function determining means.

Thus, an advantageous effect can be brought about in that the time required to write the testing m-bit data into the memory device can be shortened and the time required to make a decision as to the function of the memory device can be also cut down, thus making it possible to shorten the total time required to perform a unit test of the memory device.

According to a second aspect of the present invention, there is provided a test circuit wherein the data writing means comprises, a D flip-flop for capturing the m-bit data from the input/output terminal by the one-shot clock and immediately outputting the captured m-bit data; and a data line for causing the m-bit data outputted from the D flip-flop to branch to n to thereby provide n the m-bit data identical to each other, the function determining means comprises, a selected data output unit for outputting one of n the m-bit data read from the memory device to the input/output terminal based on one selection signal; and a coincidence/non-coincidence determining unit for making a decision as to the coincidence or non-coincidence between n the m-bit data read from the memory device and monitoring the results of decision, and the wide data bus is connected to the data lines allowed to branch to n, the memory device, the selected data output unit and the coincidence/non-coincidence determining unit and is capable of performing the transfer of n the m-bit data therebetween.

Thus, an advantageous effect can be brought about in that when the data is written into the memory device, the number of clocks to be written can be reduced by (n−1) times as compared with the conventional test circuit using the shift register, whereas when the data written into the memory device is read (the decision as to the function of the memory device is made), a job required for the conventional test circuit, for switching the selection signal n times to thereby read the m-bit data from the input/output terminal and comparing the read m-bit data and the m-bit expected value n times becomes unnecessary, so that the comparison therebetween can be settled at one time, thus making it possible to shorten a test time interval.

According to a third aspect of the present invention, there is provided a test circuit further comprising test pattern generating means for generating test patterns for detecting a failure in the coincidence/non-coincidence determining unit and transferring the generated test patterns to the coincidence/non-coincidence determining unit through the wide data bus.

Thus, an advantageous effect can be brought about in that the function of the memory device can be prevented from being misjudged due to the failure in the coincidence/non-coincidence determining means.

Typical ones of various inventions of the present application have been shown in brief. However, the various inventions of the present application and specific configurations of these inventions will be understood from the following description.

BRIEF DESCRIPTION OF THE DRAWINGS

Other objects and advantages of the present invention will be more completely understood from the following detailed description, taken in conjunction with the accompanying drawings wherein:

FIG. 3 is a circuit diagram depicting a conventional test circuit.

DETAILED DESCRIPTION OF THE PREFERRED EMBODIMENTS

Preferred embodiments of the present invention will hereinafter be described in detail with reference to the accompanying drawings.

Embodiment 1

Figure 1:
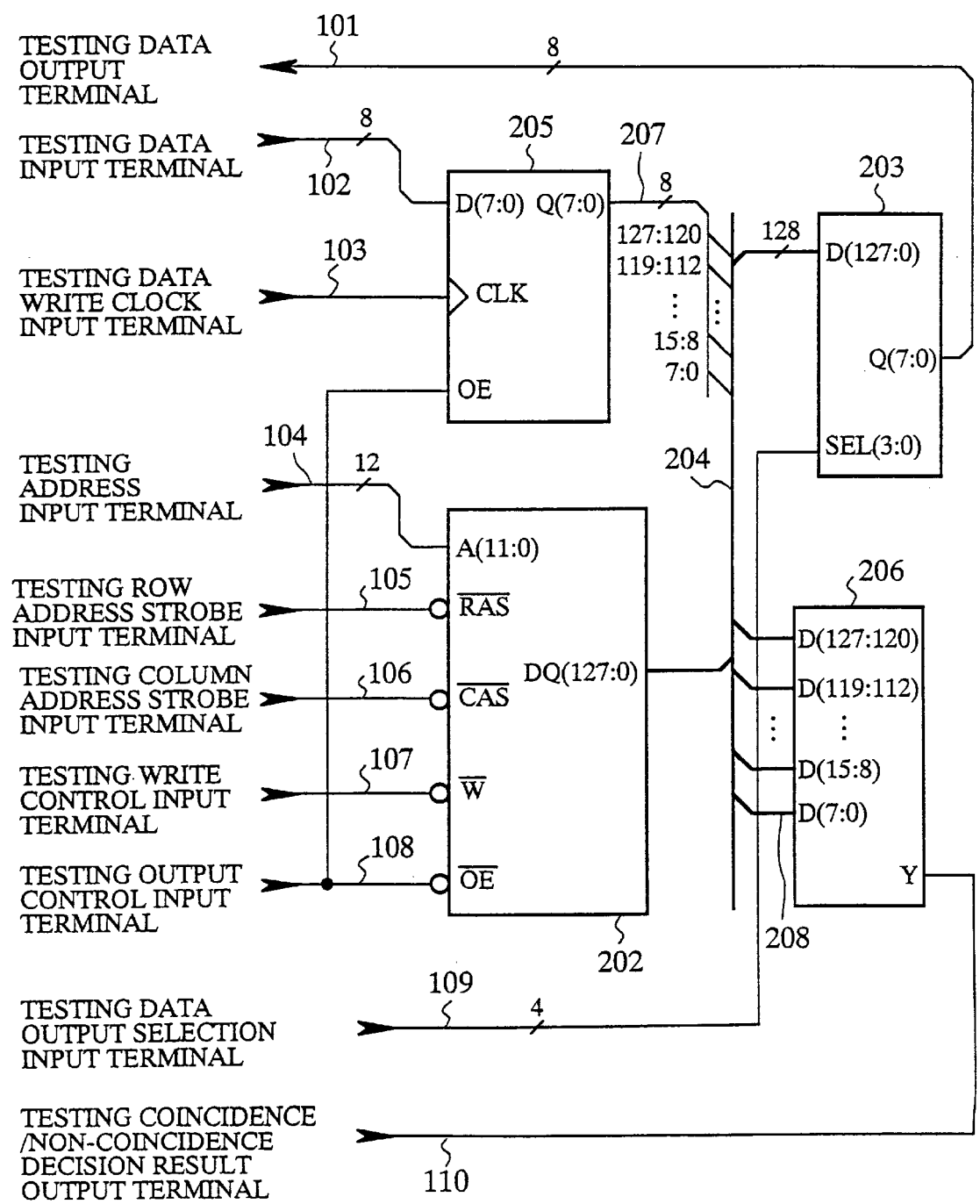
FIG. 1 is a circuit diagram showing a test circuit according to a first embodiment of the present invention.

FIG. 1 is a circuit diagram showing a test circuit according to a first embodiment of the present invention. In the drawing, reference numeral 205 indicates a D flip-flop (corresponding to a data writing means) for writing testing data (m bit data) of m bits (where m: 0 or natural numbers) inputted from a testing data input terminal (input/output terminal) 102 in response to a clock pulse inputted from a testing data write clock input terminal 103 and immediately outputting the m-bit testing data. Incidentally, the D flip-flop 205 shown in FIG. 1 shows the writing of 8-bit testing data therein. Further, the D flip-flop 205 controls an output, based on a control signal inputted from a testing output control input terminal 108 in a manner similar to the shift register 201 employed in the conventional test circuit shown in FIG. 3. Reference numeral 202 indicates a 16-Mbit DRAM which serves as a memory device to be tested. The DRAM 202 inputs or receives addresses (row and column addresses) in accordance with control signals supplied from a testing address input terminal 104, a testing row address strobe input terminal 105 and a testing column address strobe input terminal 106 and writes the testing data of the D flip-flop 205 into or at the input addresses in accordance with a control signal inputted from a testing write control input terminal 107. Further, the DRAM 202 is also provided with the function of controlling an output, based on a control signal (corresponding to a control signal obtained by inverting the control signal inputted to the D flip-flop 205) supplied from the testing output control input terminal 108 in a manner similar to the D flip-flop 205. Reference numeral 203 indicates a multiplexer (corresponding to a selected data output unit and a function determining means) for outputting specific input data (n m-bit data (where n: 0 or natural numbers)) selected in accordance with a selection control signal (selection signal) inputted from a testing data output selection input terminal 109 to a testing data output terminal 101. Reference numeral 206 indicates a coincidence/non-coincidence determining circuit (corresponding to a coincidence/non-coincidence determinator and a function determining means) for making a decision as to the coincidence or non-coincidence between the respective n m-bit data. The result of decision by the coincidence/non-coincidence determining circuit 206 is outputted to a testing coincidence/non-coincidence decision result output terminal 110. Incidentally, the coincidence/non-coincidence determining circuit 206 shown in FIG. 1 makes a decision as to the coincidence/non-coincidence between 16 8-bit data.

Reference numeral 204 indicates a wide data bus of m×n bit width (where m: testing data bus bit width of chip and n: internal wide data bus bit width/m). The bit width of the wide data bus 204 is represented as 8×16 (128). Reference numeral 207 indicates a m-bit data line (corresponding to a data writing means) for connecting the D flip-flop 205 and the wide data bus 204 to each other. The data line 207 causes the same data of m bits to branch to n as they are, and sends n m-bit data to the m×n bit wide data bus 204. Incidentally, the data line 207 causes 8-bit data to branch to 16 lines. Reference numerals 208 indicate m-bit data lines (corresponding to the coincidence/non-coincidence determinator and function determining means) for connecting the wide data bus 204 and the coincidence/non-coincidence determining circuit 206 to each other. The data lines 208 distribute m×n-bit data delivered from the wide data bus 204 to n m-bit data identical to each other and sends the m×n data to the coincidence/coincidence determining circuit 206. The data lines 208 distribute 128-bit data to 16 8-bit data identical to each other. Further, reference numerals (4, 8, 12 and 128) assigned to the respective wiring or conductors respectively indicate the number of bits of data to be transferred.

The aforementioned testing data input terminal 102 and testing data output terminal 101 of the chip may be placed in common use as a two-way or bidirectional terminal for the m-bit data.

Although the DRAM 202 is illustrated as the memory device, it may be a memory device such as an SRAM or the like.

The operation of the present embodiment will next be described.

(1) The operation of writing of the testing data into the DRAM 202 will first be explained.

The 8-bit testing data inputted from the testing data input terminal 102 is written into the D flip-flop 205 by a clock pulse in response to the leading edge of the clock pulse inputted from the testing data write clock input terminal 103. The written 8-bit testing data is immediately outputted from a Q (7:0) of the D flip-flop 205.

The D flip-flop 205 and the DRAM 202 are both provided with the output control functions. When the control signal inputted from the testing output control in put terminal 108 is of H level (1), the outputs Q (7:0) of the D flip-flop 205 are prohibited from outputting data. On the other hand, since the DRAM 202 inputs or receives L level (0) obtained by inverting the control signal of the H level (1), the DRAM 202 is kept in a state in which it may output data from outputs DQ (127:0). Conversely, when the control signal inputted from the testing output control input terminal 108 is of the L level (0), the D flip-flop 205 outputs the 8-bit testing data from the outputs Q (7:0). On the other hand, since the DRAM 202 is supplied with the H level (1) obtained by inverting the control signal of the L level (0), the outputs DQ (127:0) of the DRAM 202 are prohibited from outputting. Thus, since the output control functions are provided in this way, the data outputted from the D flip-flop 205 and the DRAM 202 do not collide with each other on the wide data bus 204. Incidentally, the control signal inputted from the testing output control input terminal 108 is L level (0) in level upon the testing data write operation.

The 8-bit testing data, i.e., the same 8-bit data outputted from the outputs Q (7:0) of the D flip-flop 205 is caused to branch to 16 as they are through the data line 207. Further, the 16 same 8-bit data (i.e., 128-bit data) are written into the DRAM 202 through the wide data bus 204 having the 128-bit width in one write operation.

During a write operation, the DRAM 202 receives L level (0) obtained by inverting a control signal of H level (1) from the testing write control input terminal 107. Upon read operation, the DRAM 202 is supplied with H level (1) obtained by inverting a control signal of L level (0) from the testing write control input terminal 107. Thus, when the 128-bit testing data is written into the DRAM 202, the control signal of the H level (1) is sent from the testing write control input terminal 107.

It is necessary to write addresses into the DRAM 202 before the testing data is written into the DRAM 202. However, this address writing is executed as follows: The addresses are inputted from the testing address input terminal 104 as 12-bit address data upon writing of the addresses, and the row and column addresses are written into the DRAM 202 based on the control signals inputted from the testing row address strobe input terminal 105 and the testing column address strobe input terminal 106.

Further, the row addresses are represented as combinations of [1,0] corresponding to 12 bits of the address data inputted from the testing address input terminal 104, i.e., $2^{12}$ rows (4096 rows), whereas the column addresses are represented as combinations of [1,0] corresponding to 5 bits of 12 bits of the address data, i.e., $2^5$ columns (32 columns).

(2) The operation of reading of the testing data written into the DRAM 202 (at the time of the determination as to the function of the DRAM 202) will next be explained.

The control signal inputted from the testing output control input terminal 108 is switched to the H level (1) (the inverted signal L level (0) is inputted to the DRAM 202) to thereby bring the DQ (127:0) of the DRAM 202 into a state in which it may output data. Further, the control signal inputted from the testing write control input terminal 107 is switched to the L level (0) (the inverted signal H level (1) is inputted to the DRAM 202) to thereby place the outputs DQ (127:0) of the DRAM 202 in a data read state. The 128-bit testing data (the 16 same 8-bit data) written into the DRAM 202 are read out in one read operation and transferred to the multiplexer 203 and the coincidence/non-coincidence determining circuit 206 through the wide data bus 204.

The 128-bit testing data (the 16 same 8-bit data) transferred from the DRAM 202 are written into the multiplexer 203. The selection control signal inputted from the testing data output selection input terminal 109 is fixed to a given value and one 8-bit data of the 16 same 8-bit data is read from the multiplexer 203 through the testing data output terminal 101 of the chip. Next, the read 8-bit testing data is compared with a prepared 8-bit expected value once.

Further, the 128-bit testing data (the 16 same 8-bit data) transferred from the DRAM 202 are distributed to the same 16 data of 8 bits through the data lines 208, which in turn are sent to the coincidence/non-coincidence determining circuit 206. Thereafter, the coincidence/non-coincidence determining circuit 206 makes a decision as to the coincidence or non-coincidence between the same 16 data of 8 bits and monitors the results of decision by the coincidence/non-coincidence determining circuit 206 through the testing coincidence/non-coincidence decision result output terminal 110. If the DRAM 202 is normal, then the 16 data of 8 bits coincide with each other. If a defective point occurs in the DRAM 202, then they do not coincide with each other. If the output result is 1, for example, then the 16 data of 8 bits are found to coincide with each other. On the other hand, if the output result is 0, then they are found not to coincide with each other.

Thus, if the 8-bit testing data outputted from the testing data output terminal 101 coincides with the prepared 8-bit expected value and the decision results at the testing coincidence/non-coincidence decision result output terminal 110 coincide with each other, then the DRAM 202 is judged to be normal. If either the output results at the testing data output terminal 101 or the output results at the testing coincidence/non-coincidence decision result output terminal 110 do not coincide with each other, then the DRAM 202 is judged to be abnormal.

According to the first embodiment as described above, the m-bit testing data is written into the D flip-flop 205 by the clock pulse and outputted therefrom. Further, the data line 207 causes the m-bit testing data to branch to n m-bit data identical to each other and the testing data of m×n bits is written into the DRAM 202 in one write operation. Therefore, the number of write clocks can be reduced by (n−1) times as compared with the conventional test circuit using the shift register 201.

Further, the selection control signal inputted from the testing data output selection input terminal 109 is fixed and the comparison between the m-bit testing data outputted from the multiplexer 203 to the testing data output terminal 101 and the m-bit expected value is performed once. Further, the coincidence/non-coincidence determining circuit 206 monitors the coincidence or non-coincidence between the n same m-bit data and makes a decision as to whether all the m×n bit outputs of the DRAM 202 are normal or abnormal. Therefore, the comparison between the m-bit testing data and the m-bit expected value may be performed once and a test time interval can be shortened in the first embodiment although it is necessary for the conventional test circuit to switch the selection control signal inputted from the testing data output selection input terminal 109 n times, read out the m-bit testing data of the chip from the testing data output terminal 101 and compare the read data with the m-bit expected value n times.

Embodiment 2

The above-described first embodiment has described the case in which the m-bit data outputted from the multiplexer 203 to the testing data output terminal 101 is compared with the prepared m-bit expected value and the coincidence/non-coincidence determining circuit 206 determines whether or not the n m-bit data coincide, whereby the DRAM 202 is tested for normal operation. However, the test circuit according to the above-described first embodiment might judge the DRAM 202 to be normal even though the DRAM 202 is abnormal, where a failure (e.g., a degenerative fault at a certain node) or the like occurs in the coincidence/non-coincidence determining circuit 206. For example, even though given data represented in the form of one bit is stored as 0 due to the normal state of the DRAM 202 where all the m-bit data are 1 (all 1) in fact, its corresponding bit (bit of data indicative of 0) is always represented as 1 due to the degenerative fault at the corresponding node in the coincidence/non-coincidence determining circuit 206. In such a case, the coincidence/non-coincidence determining circuit 206 determines that the n m-bit data coincide with each other and judges the DRAM 202 to be normal even though the DRAM 202 is abnormal.

Thus, the second embodiment is constructed so as to detect the failure in the coincidence/non-coincidence determining circuit 206 and prevent the coincidence/non-coincidence determining circuit 206 from being misjudged due to its failure.

Figure 2:
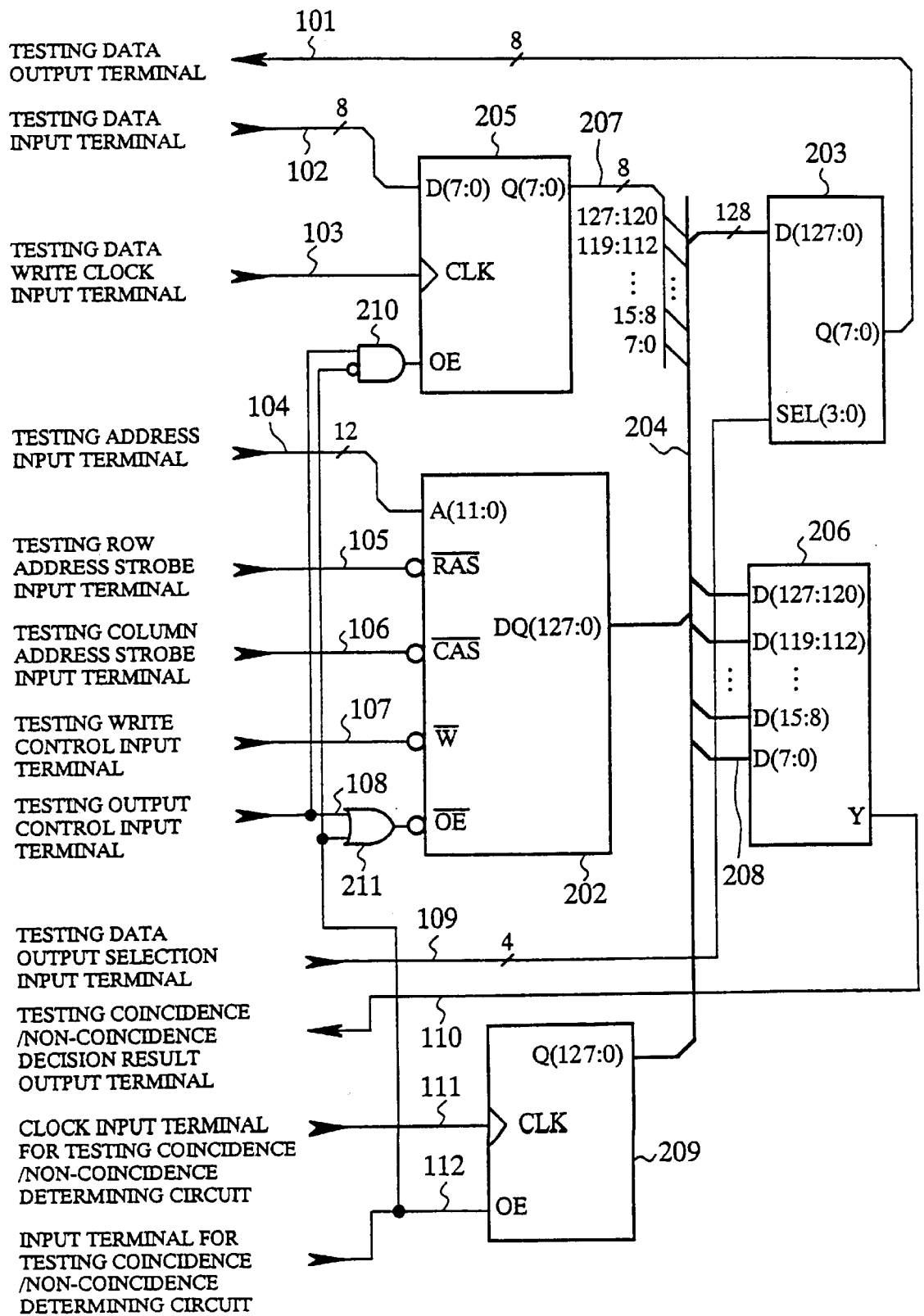
FIG. 2 is a circuit diagram illustrating a test circuit according to a second embodiment of the present invention.

FIG. 2 is a circuit configurational diagram showing a test circuit according to such a second embodiment of the present invention. In the drawing, reference numeral 209 indicates a test pattern generating circuit (test pattern generating means) for generating test patterns for detecting a failure in a coincidence/non-coincidence determining circuit 206 and supplying the generated test patterns to the coincidence/non-coincidence determining circuit 206. The test pattern generating circuit 209 controls an output, based on a control signal inputted from an input terminal 112 used for testing the coincidence/non-coincidence determining circuit. Reference numeral 210 indicates an AND circuit for ANDing a control signal inputted from a testing output control input terminal 108 and an inversion signal obtained by inverting the control signal inputted from the input terminal 112 and outputting the result of ANDing to a D flip-flop 205. Reference numeral 211 indicates an OR circuit for ORing the control signal inputted from the testing output control input terminal 108 and the control signal inputted from the input terminal 112 and outputting the result of ORing to a DRAM 202.

Incidentally, the same elements of structure as those shown in FIG. 1 or the elements of structure similar to those shown in FIG. 1 are identified by like reference numerals in FIG. 2 and the description of certain common elements will therefore be omitted.

The operation of the present embodiment will next be explained.

When the DRAM 202 is tested for normal or abnormal operation, the control signal inputted from the input terminal 112 is L level (0). Thus, since the AND circuit 210 is supplied with H level (1) obtained by inverting the control signal indicative of the L level (0) inputted from the input terminal 112, the output of the AND circuit 210 varies according to the control signal inputted from the testing output control input terminal 108 (i.e., if the control signal is H in level, then the AND circuit 210 outputs H level, whereas if the control signal is L in level, then the AND circuit 210 outputs L level). Since the OR circuit 211 receives the control signal indicative of the L level (0) inputted from the input terminal 112 without invention the output of the OR circuit 211 also varies according to the control signal inputted from the testing output control input terminal 108 (i.e., if the control signal is H in level, then the OR circuit 211 outputs H level, whereas if the control signal is L in level, then the OR circuit 211 outputs L level). At this time, the control signal indicative of the L level (0) inputted from the input terminal 112 is inputted to the test pattern generating circuit 209 as it is. The test pattern generating circuit 209 is controlled so as not to produce an output from one of the outputs Q (127:0) thereof.

In such a condition, a unit test of the DRAM 20 is performed in the same operation as that done in the first embodiment.

When the coincidence/non-coincidence determining circuit 206 is tested for failure, the control signal inputted from the input terminal 112 is H level (1). Thus, since the AND circuit 210 is inputted with L level (0) obtained by inverting the control signal indicative of the H level (1), the output of the AND circuit 210 is always brought to the L level (0) so that the D flip-flop 205 is prohibited from being outputted from its outputs Q (7:0).

Further, since the OR circuit 211 is supplied with the control signal indicative of the H level (1) without inversion, the output of the OR circuit 211 is always brought to the H level (1) and thereby the inverted L level (0) is inputted to the DRAM 202, whereby the DRAM 202 is prohibited from being outputted from its outputs DQ (127:0). On the other hand, the outputs Q (127:0) of the test pattern generating circuit 209 enters into a state in which it may output, so that test pattern data is transferred to the coincidence/non-coincidence determining circuit 206 through a wide data bus 204. Thus, the output control of the D flip-flop 205, DRAM 202 and test pattern generating circuit 209 allows the prevention of occurrence of the collision between data on the wide data bus 204.

A description will now be made of the case in which the coincidence/non-coincidence determining circuit 206 is tested for failure.

The test patterns generated from the coincidence/non-coincidence generating circuit 209 are transferred to the coincidence/non-coincidence determining circuit 206 through the wide data bus 204 extending from the outputs Q (127:0) of the test pattern generating circuit 209. As the test patterns, for example, there are provided with one pattern such that H level is successively shifted with only one bit defined as H level and the other 127 bits defined as L level, and the other pattern such that L level is successively shifted with only one bit defined as L level and the other 127 bits defined as H level to the contrary. When such test patterns are inputted to inputs D (127:120) through D (7:0) of the coincidence/non-coincidence determining circuit 206, all the decision results outputted from a testing coincidence/non-coincidence decision result output terminal 110 are brought to non-coincidence (for example, 0) if the coincidence/non-coincidence determining circuit 206 is normal. On the other hand, if a failure such as a degenerative fault occurs in the coincidence/non-coincidence determining circuit 206, there may be cases where all the decision results outputted from the testing coincidence/non-coincidence decision result output terminal 110 are brought to coincidence (for example, 1). The degenerative fault of the H or L level of the coincidence/non-coincidence determining circuit 206 is detected in the above-described manner.

According to the second embodiment as described above, since the test patterns generated from the test pattern generating circuit 209 are sent to the coincidence/non-coincidence determining circuit 206 where the failure in coincidence/non-coincidence determining circuit 206 is detected, the function of the DRAM 202 can be prevented from being misjudged due to the failure in coincidence/non-coincidence determining circuit 206.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A test circuit comprising:

a memory device;

data writing means for outputting m-bit data immediately after the m-bit data is captured from an input/output terminal of said data writing means in response to a clock signal, branching the m-bit data to n identical m-bit signals, and writing the n m-bit data signals into said memory device;

function determining means for reading the n m-bit data signals written into said memory device, outputting one of the n m-bit data signals read from said memory device, comparing the one m-bit data signal read from said memory device to an m-bit expected value, and determining coincidence or non-coincidence between the one m-bit data signal read from said memory device and the m-bit expected value; and a wide data bus connected to said data writing means, said memory device, and said function determining means for transferring the n m-bit data signals between said data writing means, said memory device, and said function determining means.

2. The test circuit according to claim 1, wherein said data writing means comprises:

a D flip-flop for capturing the m-bit data from the input/output terminal of said data writing means in response to the clock signal and immediately outputting the captured m-bit data; and a data line for branching the m-bit data output from said D flip-flop into n identical m-bit data signals, said function determining means comprises:

a selected data output unit for outputting one of the n m-bit data signals read from said memory device to n input/output terminal of said selected data output unit based on a selection signal; and a coincidence/non-coincidence determining unit for determining coincidence or non-coincidence between the n m-bit data signals read from said memory device and the n m-bit data signals written into said memory device and monitoring the coincidence/non-coincidence, and said wide data bus is connected to n data lines carrying the n m-bit data signals, said memory device, said selected data output unit, and said coincidence/non-coincidence determining unit for transferring the n m-bit data signals between the n data lines, said memory device, and said selected data output unit.

3. The test circuit according to claim 2, comprising test pattern generating means for generating test patterns for detecting a failure in said coincidence/non-coincidence determining unit and transferring the generated test patterns to said coincidence/non-coincidence determining unit through said wide data bus.

* * * * *